United States Patent
Zheng et al.

(10) Patent No.: US 7,940,092 B2
(45) Date of Patent: May 10, 2011

(54) GATE DRIVER CIRCUIT FOR H BRIDGE CIRCUIT

(75) Inventors: Iven Zheng, Beijing (CN); Waley Li, Beijing (CN); Linpeng Wei, Beijing (CN); Hongwei Zhao, Beijing (CN); Weiying Li, Beijing (CN)

(73) Assignee: Freescale Semiconductor, Inc., Austin, TX (US)

( * ) Notice: Subject to any disclaimer, the term of this patent is extended or adjusted under 35 U.S.C. 154(b) by 32 days.

(21) Appl. No.: 12/554,995

(22) Filed: Sep. 8, 2009

(65) Prior Publication Data

US 2010/0079194 A1    Apr. 1, 2010

(30) Foreign Application Priority Data

Sep. 28, 2008  (CN) .......................... 2008 1 0168145

(51) Int. Cl.
*H03K 3/00* (2006.01)
(52) U.S. Cl. .......................... 327/110; 327/423; 327/588
(58) Field of Classification Search .................. 327/110, 327/423, 588
See application file for complete search history.

(56) References Cited

U.S. PATENT DOCUMENTS

| | | | | |
|---|---|---|---|---|
| 4,814,962 | A * | 3/1989 | Magalhaes et al. | 363/16 |
| 5,408,150 | A * | 4/1995 | Wilcox | 327/108 |
| 5,434,528 | A | 7/1995 | Nuechterlein | |
| 5,736,973 | A | 4/1998 | Godfrey et al. | |
| 5,990,640 | A | 11/1999 | Dwyer et al. | |
| 6,107,844 | A * | 8/2000 | Berg et al. | 327/110 |
| 6,333,617 | B1 | 12/2001 | Itabashi et al. | |
| 6,753,658 | B2 | 6/2004 | Caron | |
| 6,900,657 | B2 | 5/2005 | Bui et al. | |
| 7,112,929 | B2 * | 9/2006 | Chiou | 315/224 |
| 7,301,376 | B2 * | 11/2007 | Capodivacca et al. | 327/112 |
| 7,382,116 | B2 * | 6/2008 | Endo et al. | 323/282 |
| 7,477,082 | B2 * | 1/2009 | Fukazawa | 327/108 |
| 7,583,111 | B2 * | 9/2009 | Galvano | 327/112 |
| 2007/0080708 | A1 | 4/2007 | Chellamuthu et al. | |
| 2009/0066402 | A1 | 3/2009 | Hiyama | |
| 2009/0154905 | A1 | 6/2009 | Strike et al. | |

* cited by examiner

*Primary Examiner* — Kenneth B. Wells
(74) *Attorney, Agent, or Firm* — Charles Bergere

(57) ABSTRACT

An H bridge circuit includes a gate driver circuit coupled to a gate of an NMOS device. The output of the gate driver circuit is at a voltage from 0.1V to 0.4V during a dead time of the H bridge circuit. The gate voltage of the NMOS device is biased at 0.1~0.4V to overcome the problems of minority carrier injection and power dissipation as compared with $V_G=0$ in a conventional H bridge circuit.

7 Claims, 4 Drawing Sheets

GATE DRIVER CIRCUIT FOR H BRIDGE CIRCUIT

BACKGROUND OF THE INVENTION

The present invention relates to an H bridge circuit, and more particularly, to a new gate drive method for an H bridge circuit.

An H bridge circuit is a type of circuit that is well known to those the skilled in the art. If there is no Schottky diode in the H bridge circuit, the current through the inductor can induce the turn-on of both the body diode and the parasitic NPN device during dead time.

FIG. 1 is a schematic diagram showing a cross-section of a conventional isolated NMOS device. The minority carrier injection and power dissipation will happen when there is a large current in the parasitic NPN device.

In the prior art, the gate drive voltage is 0 and there is no current assignment between the NMOS device and the parasitic NPN device during the dead time. Injection of a substrate minority carrier can induce a function error and performance degradation of the circuit. The large current in the parasitic NPN device can sometimes greatly increase the power dissipation and other potential issues, such as self-heating effects, reliability, and so on.

It would be advantageous to have an H bridge circuit that is not susceptible to the above described problems.

BRIEF DESCRIPTION OF THE DRAWINGS

The objects and advantages of the present invention will be more apparent to the skilled in the art with reference to the accompanying drawings, in which.

DETAILED DESCRIPTION OF PREFERRED EMBODIMENTS

Figure 1:
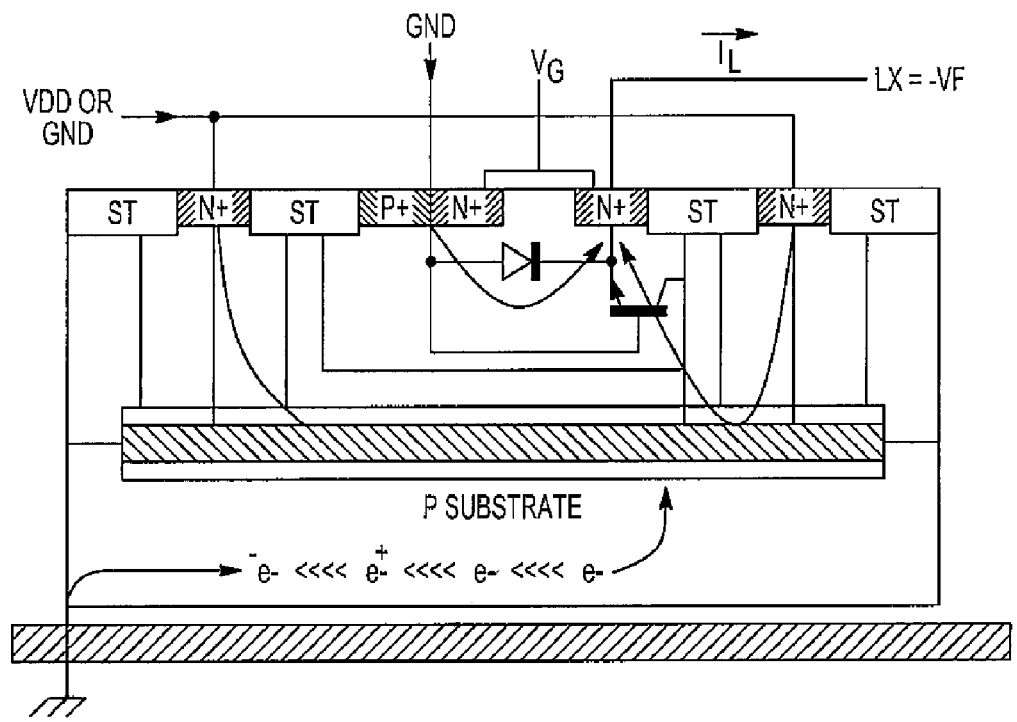
FIG. 1 is a schematic diagram showing a cross section of a conventional isolated NMOS device.

Various embodiments will be described in detail below with reference to the accompanying drawings. In order to solve the above-mentioned problems, a new gate drive method for an H bridge circuit is provided in the present invention.

According to a first aspect of the present invention, an H bridge circuit comprises a first P-channel Metal Oxide Semiconductor (PMOS) device and a first N-channel Metal Oxide Semiconductor (NMOS) device, wherein the first PMOS device and the first NMOS device are coupled in series between a voltage source and a GND. A gate driver for the first PMOS device is coupled to a gate of the first PMOS device. A gate driver circuit for the first NMOS device is coupled to a gate of the first NMOS device. The output of the gate driver circuit for the first NMOS device is maintained at a voltage from 0.1V to 0.4V during a dead time of the H bridge circuit, and preferably, the output of the first NMOS gate driver circuit is at a voltage of 0.4V.

The gate driver circuit for the first NMOS device may comprise a driver and an amplifier (AMP), where the non-inverting input of the AMP is at a voltage from 0.1V to 0.4V, and the inverting input of the AMP is coupled to the gate of the first NMOS device. A switch circuit includes a first switch and a second switch. The output of the driver is provided to the gate of the first NMOS device via the first switch and the output of the AMP is provided to the gate of the first NMOS device via the second switch. The first switch is open and the second switch is closed during the dead time of the H bridge circuit. The inverting input of the AMP may be coupled to the gate of the first NMOS device via the second switch.

The driver may comprise two pre-drivers, the first switch may comprise two first switches, and the second switch may comprise two second switches. The gate driver circuit for the first NMOS device further comprises a second PMOS device and a second NMOS device coupled in series between the voltage source and the GND. The outputs of the two pre-drivers are coupled to a gate of the second PMOS device and a gate of the second NMOS device, respectively, via the two first switches. The output of the AMP is coupled to the gate of the second PMOS device and the gate of the second NMOS device, respectively, via the two second switches. The output of the gate driver circuit for the first NMOS device is provided at a node between the second PMOS device and the second NMOS device, and the inverting input of the AMP is directly coupled to the gate of the first NMOS device.

According to a second aspect of the present invention, a gate driver circuit for an NMOS device in an H bridge circuit includes a driver and an amplifier (AMP), where the non-inverting input of the AMP is at a voltage from 0.1V to 0.4V, and the inverting input of the AMP is coupled to a gate of the NMOS device. A switch circuit includes a first switch and a second switch. The output of the driver is provided to the gate of the NMOS device via the first switch and the output of the amplifier is provided to the gate of the NMOS device via the second switch. The first switch is open and the second switch is closed during a dead time of the H bridge circuit.

The inverting input of the AMP may be coupled to the gate of the first NMOS device via the second switch. The driver may comprise two pre-drivers, the first switch may comprise two first switches, and the second switch may comprise two second switches. The gate driver circuit further comprises a PMOS device and a second NMOS device coupled with each other in series between a voltage source and a GND. The outputs of the two pre-drivers are coupled to a gate of the PMOS device and a gate of the second NMOS device, respectively, via the two first switches. The output of the AMP is coupled to the gate of the PMOS device and the gate of the second NMOS device, respectively, via the two second switches. The output of the gate driver circuit is provided at a node between the PMOS device and the second NMOS device, and the inverting input of the AMP is directly coupled to the gate of the first NMOS device.

During dead time, the gate voltage of the NMOS device is biased at 0.1~0.4V to overcome the problems of minority carrier injection and power dissipation as compared with $V_G=0$ in a conventional H bridge circuit. The increase of gate voltage can increase the current in the NMOS device which can greatly decrease the current in the body diode and the parasitic NPN device due to current conservation. The decrease of the parasitic NPN current can significantly reduce power dissipation and the injection of minority carriers, which will induce both a function error and performance degradation of the H bridge circuit. Further, the present invention can prevent large current punch-through between the PMOS device and the NMOS device because the NMOS device will work in a sub-threshold region during the punch through time.

The present invention can be used in an H bridge circuit product without a Schottky diode and a Buck converter product without a Schottky diode.

Figure 2:
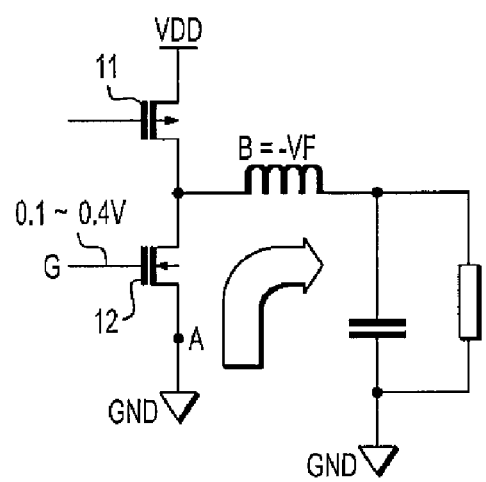
FIG. 2 is a schematic diagram showing a half H bridge circuit of the present invention.

Referring now to FIG. 2, a schematic diagram of a half H bridge circuit in accordance with the present invention is shown. The H bridge circuit comprises a PMOS device 11, and an NMOS device 12. The PMOS device 11 and the NMOS device 12 are coupled with each other in series between a voltage source VDD and a ground GND. The PMOS device 11 and the NMOS device 12 are coupled at point B, from which an output voltage is provided to a load. The PMOS device 11 is coupled to the voltage source VDD, and the NMOS device 12 is coupled to the ground GND at point A. A gate driver (not shown) for the PMOS device 11 is coupled to a gate of the PMOS device 11 and a gate driver circuit (not shown) for the NMOS device 12 is coupled to a gate G of the NMOS device 12.

Figure 3:
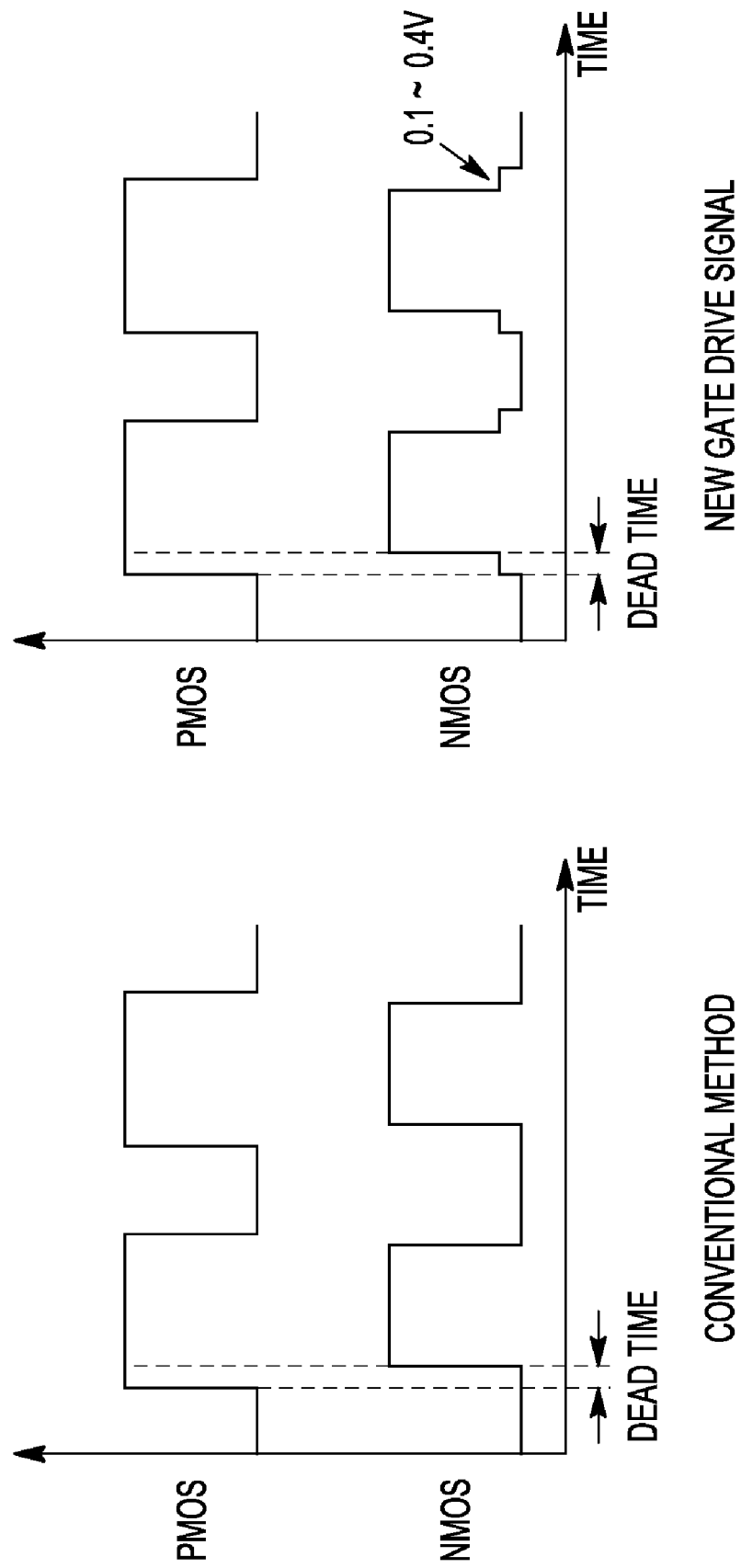
FIG. 3 shows a comparison of gate drive signals of a PMOS device and an NMOS device in the prior art and the present invention.

The output of the gate driver circuit for the NMOS device 12 is at a voltage from 0.1V to 0.4V during a dead time of the H bridge circuit, as shown in FIG. 3. During dead time, the gate voltage of the NMOS device supplied by the gate driver circuit is biased at 0.1~0.4V to overcome the problems of minority carrier injection and power dissipation as compared with $V_G=0$ in a conventional H bridge circuit.

The increase of gate voltage can increase the current in the NMOS device 12, which can greatly decrease the current in the body diode and the parasitic NPN device due to current conservation. The decrease of the parasitic NPN current can significantly reduce power dissipation and the injection of minority carriers, which will induce both a function error and performance degradation of the H bridge circuit. Further, the present invention can prevent large current punch-through between the PMOS device 11 and the NMOS device 12 because the NMOS device 12 will work in the sub-threshold region during the punch through time.

FIG. 3 shows a comparison of gate drive signals of a PMOS device and an NMOS device in the prior art and the present invention. As shown in FIG. 3, during the dead time, the voltage of the gate drive signal in the prior art is 0V, while the gate drive voltage of the NMOS device in the present invention is at 0.1~0.4V.

Figure 4A:
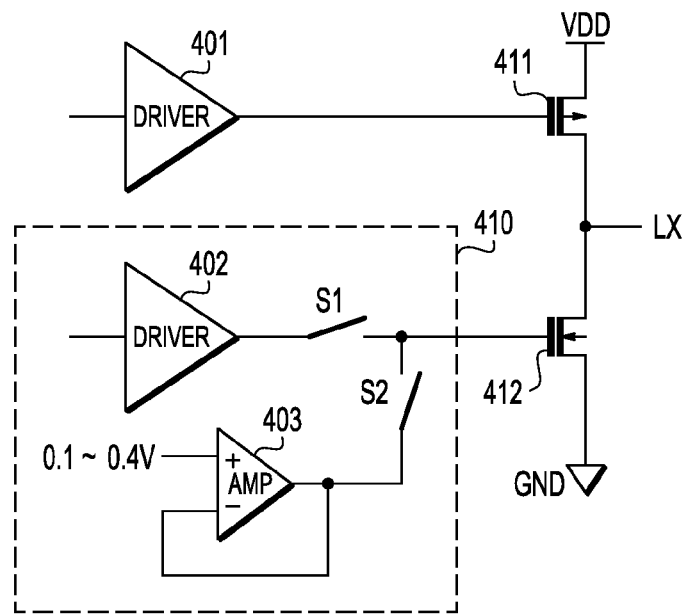
FIGS. 4A and 4B respectively show two new gate driver circuits according to embodiments of the present invention.
Figure 4B:
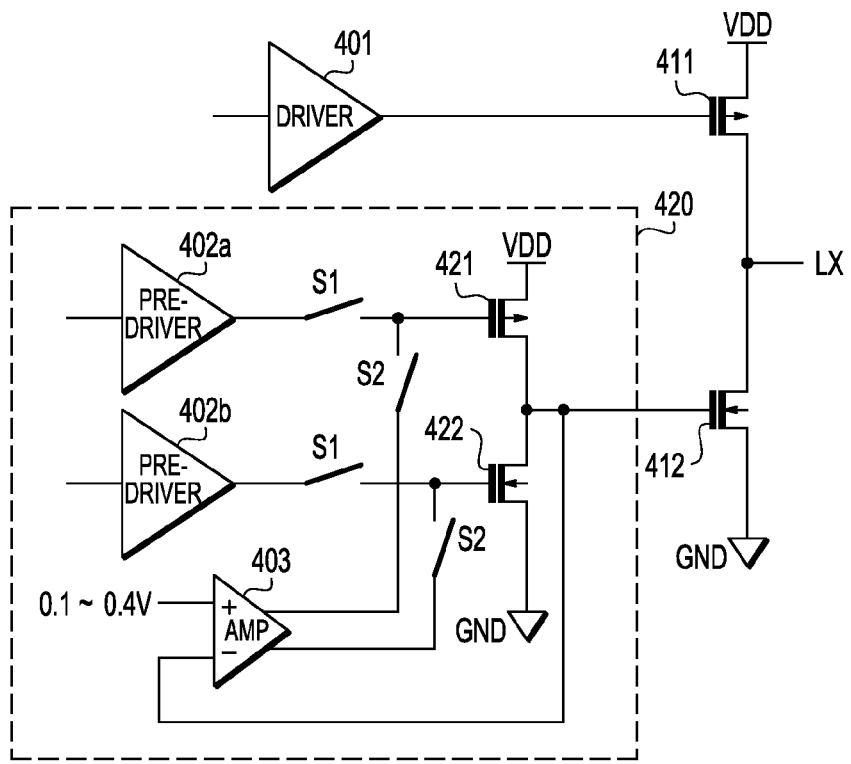

Two specific embodiments of the present invention will be given below. FIGS. 4A and 4B respectively show two new gate driver circuits according to embodiments of the present invention. FIG. 4A is a schematic diagram showing a gate driver circuit according to the first embodiment of the present invention. As shown in FIG. 4A, the H bridge circuit according to the first embodiment of the present invention comprises a first PMOS device 411 and a first NMOS device 412. The first PMOS device 411 and the first NMOS device 412 are coupled with each other in series between a voltage source VDD and a ground GND. A voltage output from a node between the first PMOS device 411 and the first NMOS device 412 is provided to a load LX. The first PMOS device 411 is coupled to the voltage source VDD, and the first NMOS device 412 is coupled to the ground GND. A gate driver 401 for the first PMOS device 411 is coupled to a gate of the first PMOS device 411, and a gate driver circuit 410 for the first NMOS device 412 is coupled to a gate of the first NMOS device 412. The output of the gate driver circuit 410 for the first NMOS device 412 is at a voltage from 0.1V to 0.4V during a dead time of the H bridge circuit.

In FIG. 4A, the gate driver circuit 410 for the first NMOS device 412 further comprises a driver 402 and an amplifier (AMP) 403. The non-inverting input of the AMP 403 is at a voltage from 0.1V to 0.4V, and the inverting input of the AMP 403 is coupled to the gate of the first NMOS device 412. A switch circuit includes a first switch S1 and a second switch S2. The output of the driver 402 is applied to the gate of the first NMOS device 412 via the first switch S1 and the output of the AMP 403 is applied to the gate of the first NMOS device 412 via the second switch S2. The first switch S1 is open and the second switch S2 is closed during the dead time of the H bridge circuit.

As shown in FIG. 4A, in the first embodiment of the present invention, both the inverting input and the output of the AMP 403 are coupled to the gate of the first NMOS device 412 via the second switch S2.

FIG. 4B is a schematic diagram showing a gate driver circuit according to a second embodiment of the present invention. As shown in FIG. 4B, the H bridge circuit according to the second embodiment of the present invention comprises a first PMOS device 411 and a first NMOS device 412. The first PMOS device 411 and the first NMOS device 412 are coupled in series between a voltage source VDD and a ground GND. A voltage output from a connection point of the first PMOS device 411 and the first NMOS device 412 is provided to a load LX. The first PMOS device 411 is coupled to the voltage source VDD, and the first NMOS device 412 is coupled to the ground GND. A gate driver 401 for the first PMOS device 411 is coupled to a gate of the first PMOS device 411, and a gate driver circuit 420 for the first NMOS device 412 is coupled to a gate of the first NMOS device 412. The output of the gate driver circuit 420 for the first NMOS device 412 is at a voltage from 0.1V to 0.4V during a dead time of the H bridge circuit.

Similar to FIG. 4A, the gate driver circuit 420 for the first NMOS device 412 in FIG. 4B also includes drivers 402a and 402b, and an amplifier (AMP) 403. The non-inverting input of the AMP 403 is at a voltage from 0.1V to 0.4V, and the inverting input of the AMP 403 is coupled to the gate of the first NMOS device 412. A switch circuit includes a first switch S1 and a second switch S2. The outputs of the drivers 402a and 402b are provided to the gate of the first NMOS device 412 via the first switch S1 and the output of the AMP 403 is provided to the gate of the first NMOS device 412 via the second switch S2. The first switch S1 is open and the second switch S2 is closed during the dead time of the H bridge circuit.

The driver circuit of FIG. 4B differs from the driver circuit of FIG. 4A in that in the second embodiment of the present invention, the driver comprises two pre-drivers 402a and 402b, the first switch S1 comprises two first switches S1, and the second switch S2 comprises two second switches S2. The gate driver circuit 420 for the first NMOS device 412 further comprises a second PMOS device 421 and a second NMOS device 422 that are coupled with each other in series between the voltage source and the GND. A voltage output from a connection point of the second PMOS device 421 and the second NMOS device 422 is provided to the gate of the first NMOS device 412. The second PMOS device 421 is coupled to the voltage source, and the second NMOS device 422 is coupled to the GND. The outputs of the two pre-drivers 402a and 402b are coupled to a gate of the second PMOS device 421 and a gate of the second NMOS device 422, respectively, via the two first switches S1. The output of the AMP 403 is coupled to the gate of the second PMOS device 421 and the gate of the second NMOS device 422, respectively, via the two second switches S2. Also, the output of the gate driver circuit 420 for the first NMOS device 412 is provided at a node between the second PMOS device 421 and the second NMOS device 422, and the inverting input of the AMP 403 is directly coupled to the gate of the first NMOS device 412 without passing through the first switch S1 or the second switch S2.

Figure 5:
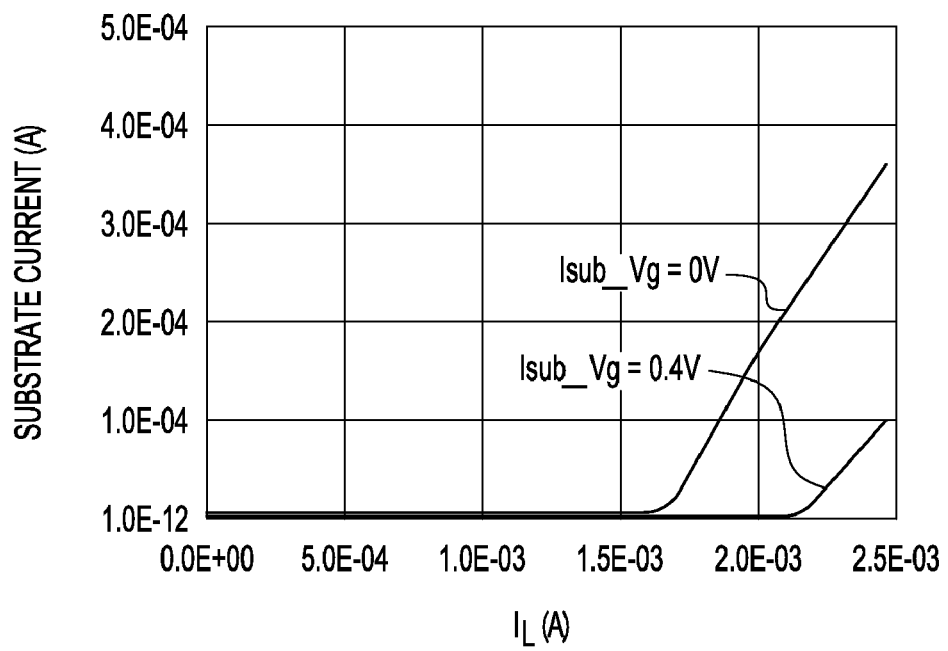
FIG. 5 shows a comparison of the variation of a substrate current versus a load current in the prior art and the present invention.

FIG. 5 shows a comparison of variation in substrate current Isub versus a load current $I_L$ in the prior art and the present invention. As shown in FIG. 5, the measurement results show that the increase of the gate voltage Vg of the NMOS device reduces minority carrier injection (the substrate current Isub), wherein the output voltage of the gate driver circuit for the first NMOS device, i.e., the gate voltage Vg of the first NMOS device, is 0.4V.

Figure 6:
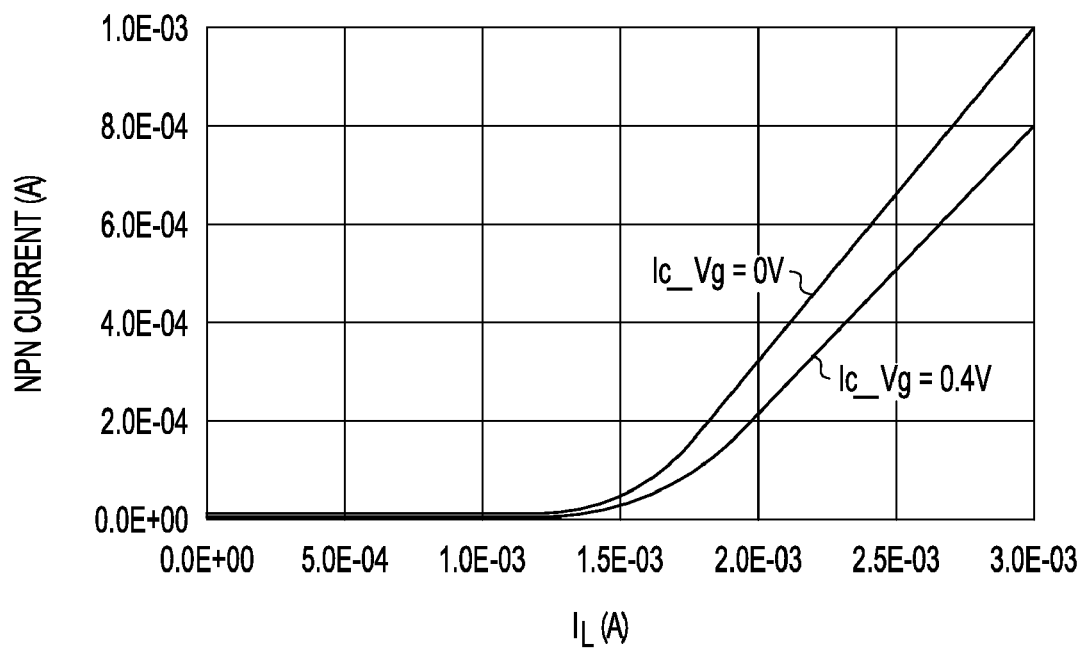
FIG. 6 shows a comparison of the variation of a parasitic NPN current versus a load current in the prior art and the present invention.

FIG. 6 shows a comparison of variation in a parasitic NPN current Ic versus a load current $I_L$ in the prior art and the present invention. As shown in FIG. 6, the measurement results show that the current Ic in the parasitic NPN device is also decreased, wherein the output voltage of the gate driver circuit for the first NMOS device, i.e., the gate voltage Vg of the first NMOS device, is 0.4V.

It can be concluded from the above measurement results that the gate drive method of the present invention can solve the problems of minority carrier injection and large current in a parasitic NPN device in the prior art. The present invention is applicable to an H bridge circuit product without Schottky diode and a BUCK converter product without Schottky diode, but is not limited to those.

The invention claimed is:

1. An H bridge circuit, comprising:
a first P-channel Metal Oxide Semiconductor (PMOS) device;
a first N-channel Metal Oxide Semiconductor (NMOS) device, the first PMOS device and the first NMOS device being coupled in series between a voltage source and a ground (GND);
a gate driver for the first PMOS device, coupled to a gate of the first PMOS device; and
a gate driver circuit for the first NMOS device, coupled to a gate of the first NMOS device, wherein the output of the gate driver circuit for the first NMOS device is at a voltage from 0.1V to 0.4V during a dead time of the H bridge circuit, and
wherein the gate driver circuit for the first NMOS device comprises:
a driver having an output;
an amplifier (AMP) having a non-inverting input at a voltage from 0.1V to 0.4V, an inverting input coupled to the gate of the first NMOS device, and an output; and
a switch circuit that includes a first switch and a second switch, wherein the output of the driver is provided to the gate of the first NMOS device via the first switch and the output of the AMP is provided to the gate of the first NMOS device via the second switch, and
wherein the first switch is open and the second switch is closed during the dead time of the H bridge circuit.

2. The H bridge circuit of claim 1, wherein the output of the gate driver circuit for the first NMOS device is at a voltage of 0.4V.

3. The H bridge circuit of claim 1, wherein the inverting input of the AMP is coupled to the gate of the first NMOS device via the second switch.

4. The H bridge circuit of claim 1, wherein:
the driver comprises two pre-drivers, the first switch comprises two first switches, and the second switch comprises two second switches,
the gate driver circuit for the first NMOS device further comprises a second PMOS device and a second NMOS device coupled with each other in series between the voltage source and the GND,
the outputs of the two pre-drivers are coupled to a gate of the second PMOS device and a gate of the second NMOS device, respectively, via the two first switches,
the output of the AMP is coupled to the gate of the second PMOS device and the gate of the second NMOS device, respectively, via the two second switches, and
the output of the gate driver circuit for the first NMOS device is provided at a node between the second PMOS device and the second NMOS device, and the inverting input of the AMP is directly coupled to the gate of the first NMOS device.

5. A gate driver circuit for an N-channel Metal Oxide Semiconductor (NMOS) device in an H bridge circuit, comprising:
a driver;
an amplifier (AMP), wherein a non-inverting input of the AMP is at a voltage from 0.1V to 0.4V, and an inverting input of the AMP is coupled to a gate of the NMOS device; and
a switch circuit that includes a first switch and a second switch, wherein an output of the driver is provided to the gate of the NMOS device via the first switch and the output of the amplifier is provided to the gate of the NMOS device via the second switch,
wherein the first switch is open and the second switch is closed during a dead time of the H bridge circuit.

6. The gate driver circuit of claim 5, wherein the inverting input of the AMP is coupled to the gate of the first NMOS device via the second switch.

7. The gate driver circuit of claim 5, wherein:
the driver comprises two pre-drivers, the first switch comprises two first switches, and the second switch comprises two second switches;
the gate driver circuit further comprises a P-channel Metal Oxide Semiconductor (PMOS) device and a second NMOS device coupled with each other in series between a voltage source and a GND;
the outputs of the two pre-drivers are coupled to a gate of the PMOS device and a gate of the second NMOS device, respectively, via the two first switches;
the output of the AMP is coupled to the gate of the PMOS device and the gate of the second NMOS device, respectively, via the two second switches; and
the output of the gate driver circuit is provided at a point connected between the PMOS device and the second NMOS device, and the inverting input of the AMP is directly coupled to the gate of the first NMOS device.

* * * * *